United States Patent
Tabei

(10) Patent No.: US 9,048,187 B2
(45) Date of Patent: Jun. 2, 2015

(54) EPOXY RESIN COMPOSITION FOR SEMICONDUCTOR ENCAPSULATION, AND SEMICONDUCTOR DEVICE USING THE SAME

(75) Inventor: Jun-ichi Tabei, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 13/581,637

(22) PCT Filed: Mar. 16, 2011

(86) PCT No.: PCT/JP2011/001533
§ 371 (c)(1),
(2), (4) Date: Aug. 29, 2012

(87) PCT Pub. No.: WO2011/118157
PCT Pub. Date: Sep. 29, 2011

(65) Prior Publication Data
US 2012/0319306 A1      Dec. 20, 2012

(30) Foreign Application Priority Data

Mar. 25, 2010    (JP) ................. P2010-070699

(51) Int. Cl.
*C08L 63/00* (2006.01)
*C08K 5/01* (2006.01)
(Continued)

(52) U.S. Cl.
CPC ............. *H01L 23/293* (2013.01); *C08L 63/00* (2013.01); *C09J 135/00* (2013.01); *H01L 23/3107* (2013.01); *H01L 2224/45144* (2013.01); *H01L 2224/48145* (2013.01); *H01L 2224/48245* (2013.01); *H01L 2224/73265* (2013.01); *H01L 2225/06568* (2013.01); *H01L 24/48* (2013.01);
(Continued)

(58) Field of Classification Search
USPC .................. 523/463, 464; 525/120
See application file for complete search history.

(56) References Cited

U.S. PATENT DOCUMENTS

| | | | | |
|---|---|---|---|---|
| 4,399,251 A | * | 8/1983 | Lee | .............................. 524/481 |
| 4,871,823 A | * | 10/1989 | Billman et al. | ............... 526/272 |
| 2005/0222300 A1 | | 10/2005 | Ikezawa et al. | |
| 2006/0014873 A1 | | 1/2006 | Ikezawa et al. | |
| 2009/0137717 A1 | | 5/2009 | Ikezawa et al. | |
| 2012/0199992 A1 | | 8/2012 | Tabei | |

FOREIGN PATENT DOCUMENTS

| | | |
|---|---|---|
| CN | 101429324 A | 5/2009 |
| JP | 11-035793 A | 2/1999 |

(Continued)

OTHER PUBLICATIONS

Machine translation of JP 2006028264 A.*
(Continued)

*Primary Examiner* — Mark Kaucher
*Assistant Examiner* — Kregg Brooks
(74) *Attorney, Agent, or Firm* — Birch, Stewart, Kolasch & Birch, LLP

(57) ABSTRACT

Disclosed are an epoxy resin composition for semiconductor encapsulation containing (A) an epoxy resin, (B) a curing agent, (C) an inorganic filler material, (D) a hydrocarbon compound having structures of formula (1) and formula (2), and (E) a hydrocarbon compound having an ester group; and a semiconductor device including a semiconductor element encapsulated with the epoxy resin composition for semiconductor encapsulation.

$$+CH_2-CH_2+ \qquad (1)$$

$$+CH=CH+ \qquad (2)$$

6 Claims, 1 Drawing Sheet

(51) Int. Cl.
*C08K 5/10* (2006.01)
*H01L 23/29* (2006.01)
*C09J 135/00* (2006.01)
*C08K 3/00* (2006.01)
*H01L 23/31* (2006.01)
*H01L 23/00* (2006.01)

(52) U.S. Cl.
CPC ............... *H01L 2224/48247* (2013.01); *H01L 2924/01019* (2013.01); *H01L 2224/32145* (2013.01); *H01L 2224/32245* (2013.01); *H01L 2924/01012* (2013.01); *H01L 2924/01013* (2013.01); *H01L 2924/01014* (2013.01); *C08K 3/0033* (2013.01); *C08K 5/01* (2013.01); *C08K 5/10* (2013.01); *H01L 2924/10253* (2013.01); *H01L 2924/15747* (2013.01); *H01L 24/45* (2013.01); *H01L 2224/45015* (2013.01); *H01L 2924/1301* (2013.01)

(56) References Cited

FOREIGN PATENT DOCUMENTS

| | | | |
|---|---|---|---|
| JP | 2000-17045 | A | 1/2000 |
| JP | 2001-247748 | A1 | 9/2001 |
| JP | 2003-64239 | A | 3/2003 |
| JP | 2006028264 | A * | 2/2006 |
| JP | 3975386 | B2 | 9/2007 |
| JP | 4010176 | B2 | 11/2007 |
| JP | 2009-149737 | A | 7/2009 |
| TW | 200710161 | A | 3/2007 |
| WO | WO 2011/048765 | A1 | 4/2011 |

OTHER PUBLICATIONS

International Search Report for PCT/JP2011/001533 mailed on Jun. 14, 2011.

* cited by examiner

EPOXY RESIN COMPOSITION FOR SEMICONDUCTOR ENCAPSULATION, AND SEMICONDUCTOR DEVICE USING THE SAME

TECHNICAL FIELD

The present invention relates to an epoxy resin composition for semiconductor encapsulation, and a semiconductor device using the same. More particularly, the present invention relates to an epoxy resin composition for semiconductor encapsulation having excellent adhesiveness to copper that has undergone oxidation, and releasability from the molding mold, in the case of using a lead frame made of copper, and a semiconductor device using the epoxy resin composition for semiconductor encapsulation.

BACKGROUND ART

In regard to the processes for assembling semiconductor devices (hereinafter, also referred to as "semiconductor packages" or "packages"), the connection between an aluminum electrode of a semiconductor element (hereinafter, also referred to as "semiconductor chip" or "chip") and the inner lead of a lead frame is currently achieved primarily by an electrical connection based on thermal compression of gold wires. Furthermore, in recent years, along with the market trend directed toward miniaturization, weight reduction and performance enhancement of electronic equipment, high integration and an increase in pin number of electronic components are in progress. Accordingly, there is a demand for wire bonding processes that are more complicated than before, and in the case of using a lead frame made of copper, it has been such that as the lead frame is exposed to a high temperature state at 200° C. to 250° C. for a long time period, oxidation of the copper surface proceeds even further.

Under such circumstances, even in the case of conventional semiconductor encapsulation materials that have excellent adhesiveness to an unoxidized copper surface, the semiconductor encapsulation materials often have poorer adhesiveness to copper in which oxidation has proceeded and the surface state is different. Thus, there are occasions in which peeling occurs at the interface between an encapsulating resin cured product and a lead frame at the time of die cutting after resin encapsulation molding or at the time of solder reflow.

Enhancing the adhesiveness between an insert article such as a lead frame and an encapsulating resin cured product in order to suppress peeling, contradicts the effect of enhancing the releasability of the encapsulating resin cured product from a molding mold. Therefore, there have been cases in which when the adhesiveness to an insert article such as a lead frame is enhanced, releasability from a molding mold is deteriorated, and thus moldability decreases.

Before the time when oxidation of a lead frame made of copper caused by high integration of electronic components caused a problem, a technique was suggested in which a polyethylene oxide wax and a semi-esterification product of a copolymer of a 1-alkene and maleic acid are added in combination as releasing agents in order to achieve a good balance between adhesiveness and releasability (see, for example, Patent Documents 1 and 2). According to this technique, although the adhesiveness to unoxidized copper and releasability are excellent, since a polyethylene oxide wax is used in combination, there is a problem that the adhesive power of the encapsulating resin to oxidized copper frames is decreased. Furthermore, when a semi-esterification product of a copolymer of a 1-alkene and maleic acid is used in combination with a non-oxidized polyethylene wax, the adhesive power is satisfactory, but there is a problem with releasability, such as trouble like cull sticking that occurs during continuous molding.

RELATED DOCUMENT

Patent Document

Patent Document 1: Japanese Patent No. 3975386
Patent Document 2: Japanese Patent No. 4010176

DISCLOSURE OF THE INVENTION

It is an object of the present invention to provide an epoxy resin composition for semiconductor encapsulation which has satisfactory adhesiveness to copper lead frames that has undergone oxidation, and has excellent releasability and continuous moldability, and a semiconductor device including an element which is encapsulated by the epoxy resin composition for semiconductor encapsulation by using a specific additive in the epoxy resin composition for semiconductor encapsulation.

According to the present invention, there is provided an epoxy resin composition for semiconductor encapsulation containing (A) an epoxy resin, (B) a curing agent, (C) an inorganic filler material, (D) a hydrocarbon compound having structures represented by formula (1) and formula (2), and (E) a hydrocarbon compound having an ester group:

$$\text{--}(\text{CH}_2\text{--}\text{CH}_2)\text{--} \tag{1}$$

$$\text{--}(\text{CH}=\text{CH})\text{--} \tag{2}$$

According to an embodiment of the present invention, in the epoxy resin composition for semiconductor encapsulation, the component (D) is an alkene.

According to an embodiment of the present invention, in the epoxy resin composition for semiconductor encapsulation, the component (D) is an alkene having 10 or more carbon atoms.

According to an embodiment of the present invention, in the epoxy resin composition for semiconductor encapsulation, the component (D) is a 1-alkene having 10 or more carbon atoms.

According to an embodiment of the present invention, in the epoxy resin composition for semiconductor encapsulation, the component (D) is a 1-alkene having 28 or more carbon atoms.

According to an embodiment of the present invention, in the epoxy resin composition for semiconductor encapsulation, the component (E) is at least one hydrocarbon compound selected from the group consisting of a compound produced by semi-esterifying a copolymer of a 1-alkene and maleic anhydride with an aliphatic alcohol, and a montanic acid ester.

According to an embodiment of the present invention, in the epoxy resin composition for semiconductor encapsulation, the component (E) is a compound produced by semi-esterifying a copolymer of a 1-alkene having 5 to 60 carbon atoms and maleic anhydride, with a long-chain aliphatic alcohol having 10 to 25 carbon atoms.

According to an embodiment of the present invention, in the epoxy resin composition for semiconductor encapsulation, the component (E) is a compound produced by semi-esterifying a copolymer of a 1-alkene having 28 to 60 carbon atoms and maleic anhydride, with a long-chain aliphatic alcohol having 15 to 20 carbon atoms.

According to an embodiment of the present invention, in the epoxy resin composition for semiconductor encapsulation, the mixing ratio of the component (D) and the component (E) is 1:4 to 1:20 as a mass ratio.

According to an embodiment of the present invention, in the epoxy resin composition for semiconductor encapsulation, the component (A) includes at least one epoxy resin selected from the group consisting of a biphenyl type epoxy resin represented by formula (3), a phenol-aralkyl type epoxy resin having a phenylene skeleton represented by formula (4), and a phenol-aralkyl type epoxy resin having a biphenylene skeleton represented by formula (5):

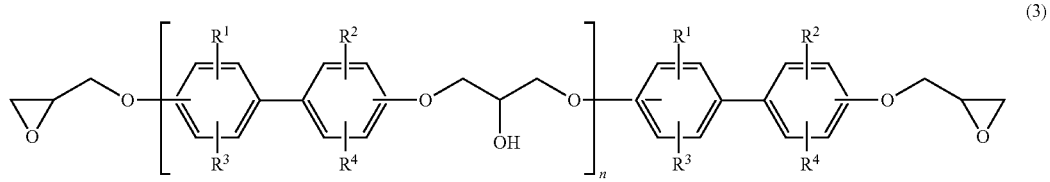
(3)

wherein in the formula (3), $R^1$ to $R^4$ each represents a hydrogen atom, or a substituted or unsubstituted hydrocarbon group having 1 to 10 carbon atoms, while $R^1$s to $R^4$s may be all identical with or different from each other; and n represents an integer from 0 to 3;

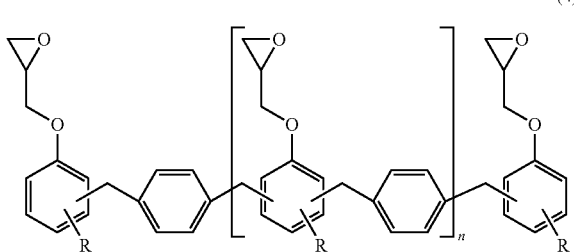
(4)

wherein in the formula (4), R represents a hydrogen atom, or a substituted or unsubstituted hydrocarbon group having 1 to 10 carbon atoms, while Rs may be all identical with or different from each other; and n represents an integer from 0 to 20; and

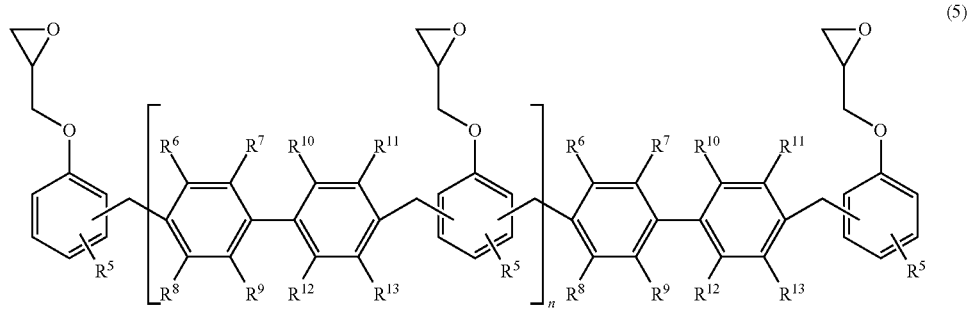
(5)

wherein in the formula (5), $R^5$ to $R^{13}$ each represents a hydrogen atom, or a substituted or unsubstituted hydrocarbon groups having 1 to 10 carbon atoms, while $R^5$s to $R^{13}$s may be all identical with or different from each other; and n represents an integer from 0 to 3.

Furthermore, according to the present invention, there is provided a semiconductor device including a semiconductor element encapsulated with the epoxy resin composition for semiconductor encapsulation described above.

According to the present invention, an epoxy resin composition for semiconductor encapsulation having excellent adhesiveness to copper lead frames that have undergone oxidation, and having excellent releasability and continuous moldability at the time of molding, can be obtained. Also, when electronic components such as IC and LSI are encapsulated using this epoxy resin composition for semiconductor encapsulation, semiconductor devices having excellent reliability can be obtained.

DESCRIPTION OF EMBODIMENTS

Figure 1:
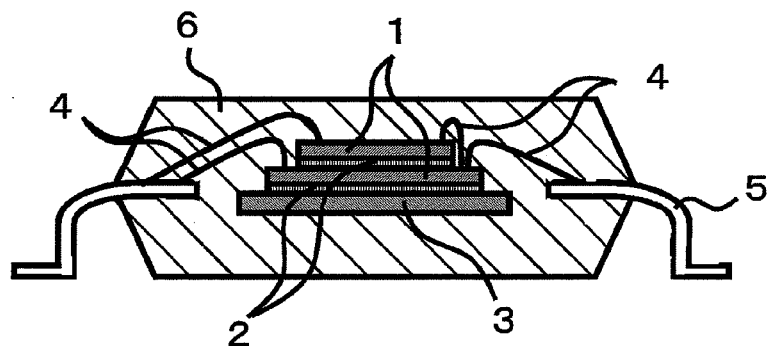
FIG. 1 is a diagram illustrating the cross-sectional structure of an example of a semiconductor device which uses an epoxy resin composition for semiconductor encapsulation according to the present invention.

The epoxy resin composition for semiconductor encapsulation of the present invention contains (A) an epoxy resin, (B) a curing agent, (C) an inorganic filler material, (D) a hydrocarbon compound having structures of formula (1) and formula (2), and (E) a hydrocarbon compound having an ester group. Thereby, an epoxy resin composition for semiconductor encapsulation having excellent adhesiveness to copper lead frames that have undergone oxidation, and having excellent releasability and continuous moldability at the time of molding, can be obtained. The semiconductor device of the present invention is characterized in that a semiconductor element is encapsulated with a cured product of the epoxy resin composition for semiconductor encapsulation described above. Thereby, a semiconductor device having excellent reliability can be obtained. Hereinafter, the present invention will be described in detail.

First, the epoxy resin composition for semiconductor encapsulation of the present invention will be explained. As the epoxy resin (A) that is used in the epoxy resin composition for semiconductor encapsulation of the present invention, any epoxy resin that is generally used in epoxy resin composition for semiconductor encapsulation can be used. Examples of such an epoxy resin include products obtained by epoxidizing novolac resins that are obtained by condensing or co-condensing phenols such as phenol, cresol, xylenol, resorcin, catechol, bisphenol A and bisphenol F, and/or naphthols such as α-naphthol, β-naphthol and dihydroxynaphthalene, with compounds having aldehyde groups such as formaldehyde, acetaldehyde, propionaldehyde, benzaldehyde and salicylaldehyde, in the presence of an acidic catalyst, including phenol-novolac type epoxy resins and ortho-cresol-novolac type epoxy resins; biphenyl type epoxy resins, which are diglycidyl ethers of bisphenol A, bisphenol F, bisphenol S, bisphenol A/D and the like, or diglycidyl ethers of alkyl-substituted or unsubstituted biphenols; epoxides of phenol-aralkyl resins synthesized from phenols and/or naphthols, and dimethoxyparaxylene or bis(methoxymethyl)biphenyl; stilbene type epoxy resins; hydroquinone type epoxy resins; glycidyl ester type epoxy resins that are obtained by a reaction between a polybasic acid such as phthalic acid or a dimer acid and epichlorohydrin; glycidylamine type epoxy resins that are obtained by a reaction between a polyamine such as diaminodiphenylmethane or isocyanuric acid, and epichlorohydrin; dicyclopentadiene type epoxy resins which are epoxides of co-condensed resins of dicyclopentadiene and phenols; epoxy resins having naphthalene rings; triphenolmethane type epoxy resins; trimethylolpropane type epoxy resins; terpene-modified epoxy resins; linear aliphatic epoxy resins that are obtained by oxidizing olefin bonds with a peracid such as peracetic acid; alicyclic epoxy resins; and epoxy resins that are obtained by modifying these epoxy resins with silicone, acrylonitrile, butadiene, isoprene rubber, a polyamide resin and the like. These resins may be used singly, or two or more kinds may be used in combination.

Among them, from the viewpoint of the adhesiveness to copper lead frames that have undergone oxidation, a biphenyl type epoxy resin represented by formula (3), a phenol-aralkyl type epoxy resin having a phenylene skeleton represented by formula (4), and a phenol-aralkyl type epoxy resin having a biphenylene skeleton represented by formula (5) are preferred.

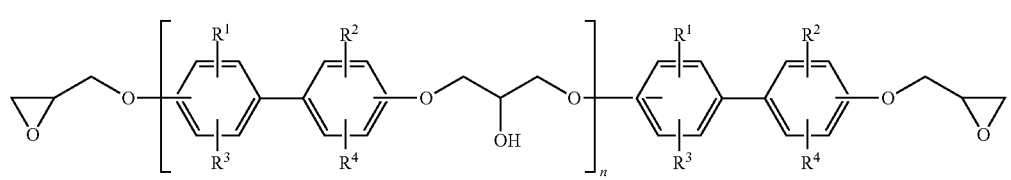

(3)

wherein in the formula (3), $R^1$ to $R^4$ each represent a hydrogen atom, or a substituted or unsubstituted hydrocarbon group having 1 to 10 carbon atoms, and $R^1$s to $R^4$s may be all identical with or different from each other; and n represents an integer from 0 to 3;

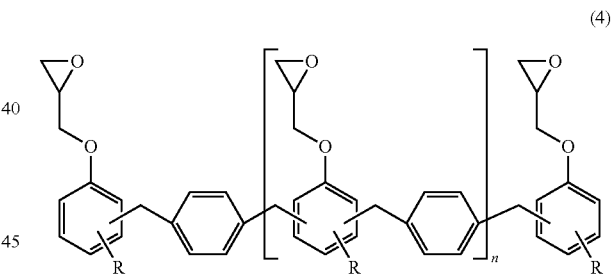

(4)

wherein in the formula (4), R represents a hydrogen atom, or a substituted or unsubstituted hydrocarbon group having 1 to 10 carbon atoms, and Rs may be all identical with or different from each other; and n represents an integer from 0 to 20; and

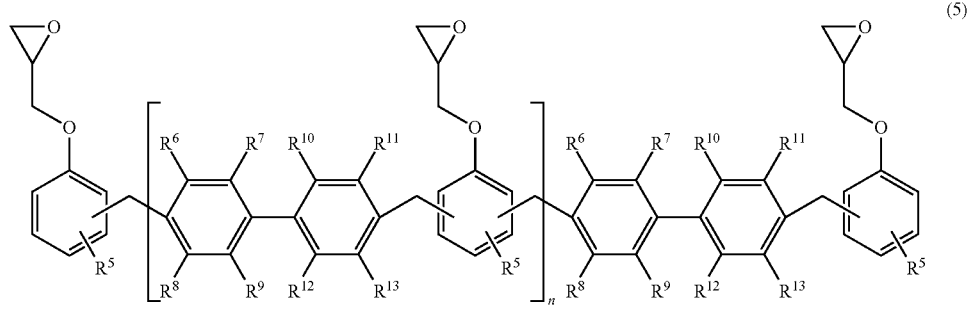

(5)

wherein in the formula (5), $R^5$ to $R^{13}$ each represent a hydrogen atom, or a substituted or unsubstituted hydrocarbon group having 1 to 10 carbon atoms, while $R^5$s to $R^{13}$s may be all identical with or different from each other; and n represents an integer from 0 to 3.

$R^1$ to $R^4$ in the formula (3) are each selected from the group consisting of a hydrogen atom; an alkyl group having 1 to 10 carbon atoms, such as a methyl group, an ethyl group, a propyl group, a butyl group, an isopropyl group, or an isobutyl group; an alkoxyl group having 1 to 10 carbon atoms, such as a methoxy group, an ethoxy group, a propoxy group, or a butoxy group; an aryl group having 6 to 10 carbon atoms, such as a phenyl group, a tolyl group, or a xylyl group; and an aralkyl group having 6 to 10 carbon atoms, such as a benzyl group or a phenethyl group; however, among them, a hydrogen atom or a methyl group is preferred. Examples of the biphenyl type epoxy resin represented by the formula (3) include epoxy resins containing 4,4'-bis(2,3-epoxypropoxy)biphenyl or 4,4'-bis(2,3-epoxypropoxy)-3,3',5,5'-tetramethylbiphenyl as a main component; and epoxy resins that are obtained by allowing epichlorohydrin to react with 4,4'-biphenol or 4,4'-(3,3',5,5'-tetramethyl)biphenol. Among these, an epoxy resin containing 4,4'-bis(2,3-epoxypropoxy)-3,3',5,5'-tetramethylbiphenyl as a main component is more preferred, and for example, YX-4000K and YX-4000H (manufactured by Japan Epoxy Resins Co., Ltd., trade names) are available as commercially marketed products. When this biphenyl type epoxy resin is used, adhesiveness to copper lead frames that have undergone oxidation is enhanced. The amount of incorporation of the resin is preferably adjusted to 20% by mass or greater, more preferably 30% by mass or greater, and even more preferably 50% by mass or greater, relative to the total amount of the epoxy resins used, in order to exhibit the performance.

R in the formula (4) is selected from the group consisting of a hydrogen atom; an alkyl group having 1 to 10 carbon atoms, such as a methyl group, an ethyl group, a propyl group, a butyl group, an isopropyl group, or an isobutyl group; an alkoxyl group having 1 to 10 carbon atoms, such as a methoxy group, an ethoxy group, a propoxy group, or a butoxy group; an aryl group having 6 to 10 carbon atoms, such as a phenyl group, a tolyl group, or a xylyl group; and an aralkyl group having 6 to 10 carbon atoms, such as a benzyl group or a phenethyl group, and among these, a hydrogen atom or a methyl group is preferred. The phenol-aralkyl type epoxy resin having a phenylene skeleton represented by the formula (4) is more preferably an epoxy resin containing an n=0 component as a main component, and for example, NC2000 (manufactured by Nippon Kayaku Co., Ltd., trade name) is available as a commercially marketed product. When this phenol-aralkyl type epoxy resin having a phenylene skeleton is used, since the distance between crosslinking points is extended, the elastic modulus of the cured product can be decreased. The amount of incorporation of the epoxy resin is preferably adjusted to 10% by mass or greater, and more preferably 20% by mass or greater, relative to the total amount of the epoxy resins used, in order to exhibit the performance.

$R^5$ to $R^{13}$ in the formula (5) are each selected from the group consisting of a hydrogen atom; an alkyl group having 1 to 10 carbon atoms, such as a methyl group, an ethyl group, a propyl group, a butyl group, an isopropyl group, or an isobutyl group; an alkoxyl group having 1 to 10 carbon atoms, such as a methoxy group, an ethoxy group, a propoxy group, or a butoxy group; an aryl group having 6 to 10 carbon atoms, such as a phenyl group, a tolyl group, or a xylyl group; and an aralkyl group having 6 to 10 carbon atoms, such as a benzyl group or a phenethyl group, and among these, a hydrogen atom or a methyl group is preferred. As the phenol-aralkyl type epoxy resin having a biphenylene skeleton represented by the formula (5), an epoxy resin containing an n=0 component as a main component is more preferred, and for example, NC-3000L (manufactured by Nippon Kayaku Co., Ltd., trade name) is available as a commercially marketed product. When this phenol-aralkyl type epoxy resin having a biphenylene skeleton is used, since the distance between crosslinking points is extended, the elastic modulus of the cured product can be decreased. The amount of incorporation of the epoxy resin is preferably adjusted to 10% by mass or greater, and more preferably 20% by mass or greater, relative to the total amount of the epoxy resins used, in order to exhibit the performance.

The biphenyl type epoxy resin represented by the formula (3), the phenol-aralkyl type epoxy resin having a phenylene skeleton represented by the formula (4), and the phenol-aralkyl type epoxy resin having a biphenylene skeleton represented by the formula (5) may be respectively used singly or in combination of two or more kinds. When two or more kinds are used in combination, the total amount of incorporation of the epoxy resins is preferably adjusted to 50% by mass or greater, and more preferably 70% by mass or greater, relative to the total amount of the epoxy resins used.

The mixing proportion of the component (A) relative to the total amount of the epoxy resins used in the epoxy resin composition for semiconductor encapsulation of the present invention is not particularly limited, but the mixing proportion is preferably equal to or greater than 1% by mass and equal to or less than 15% by mass, and more preferably equal to or greater than 2% by mass and equal to or less than 10% by mass, of the whole epoxy resin composition for semiconductor encapsulation. When the mixing proportion of the component (A) relative to the total amount of the epoxy resins is equal to or greater than the lower limit described above, the risk of causing a decrease in fluidity or the like is reduced. When the mixing proportion of the component (A) relative to the total amount of the epoxy resins is equal to or less than the upper limit described above, the risk of causing a decrease in the resistance to solder or the like is reduced.

As the curing agent (B) that is used in the epoxy resin composition for semiconductor encapsulation of the present invention, any curing agent that is generally used in epoxy resin compositions for semiconductor encapsulation can be used. Examples thereof include resins that are obtained by condensing or co-condensing phenols such as phenol, cresol, resorcin, catechol, bisphenol A, bisphenol F, phenylphenol, and aminophenol, and/or naphthols such as α-naphthol, β-naphthol, and dihydroxynaphthalene, with compounds having aldehyde groups such as formaldehyde, in the presence of an acidic catalyst, including phenol-novolac resins and cresol-novolac resins; and phenol-aralkyl resins that are synthesized from phenols and/or naphthols, and dimethoxyparaxylene or bis(methoxymethyl)biphenyl. These may be used singly, or two or more kinds may be used in combination.

Among them, from the viewpoints of fluidity and low hygroscopicity, a phenol-aralkyl resin having a biphenylene skeleton represented by formula (6) is preferred:

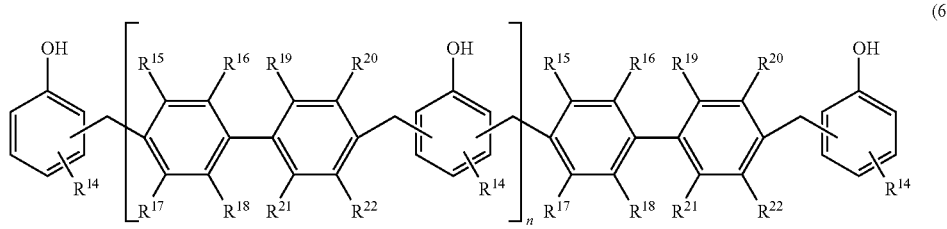

(6)

wherein $R^{14}$ to $R^{22}$ each represents a hydrogen atom, or a substituted or unsubstituted hydrocarbon group having 1 to 10 carbon atoms, while $R^{14}$s to $R^{22}$s may be all identical with or different from each other; and n represents an integer from 0 to 10.

$R^{14}$ to $R^{22}$ in the formula (6) may be all identical with or different from each other, and $R^{14}$ to $R^{22}$ are each selected from the group consisting of a hydrogen atom, and a substituted or unsubstituted hydrocarbon group having 1 to 10 carbon atoms, such as an alkyl group having 1 to 10 carbon atoms, such as a methyl group, an ethyl group, a propyl group, a butyl group, an isopropyl group or an isobutyl group; an alkoxyl group having 1 to 10 carbon atoms, such as a methoxy group, an ethoxy group, a propoxy group or a butoxy group; an aryl group having 6 to 10 carbon atoms, such as a phenyl group, a tolyl group or a xylyl group; and an aralkyl group having 6 to 10 carbon atoms, such as a benzyl group or a phenethyl group. However, among these, a hydrogen atom and a methyl group are preferred. The phenol-aralkyl resin having a biphenylene skeleton represented by the formula (6) may be, for example, a compound in which all of $R^{14}$ to $R^{22}$ are hydrogen atoms, and among others, from the viewpoint of melt viscosity, a mixture of condensates containing an n=0 component at a proportion of 50% by mass or more is preferred. As such a compound, MEH-7851SS (manufactured by Meiwa Chemical Co., Ltd., trade name) is available as a commercially marketed product. When this phenol-aralkyl resin having a biphenylene skeleton is used, the amount of incorporation of the phenol-aralkyl resin is preferably adjusted to 50% by mass or greater, and more preferably 70% by mass or greater, relative to the total amount of the curing agent used, in order to exhibit the performance.

The mixing proportion of the curing agent (B) used in the epoxy resin composition for semiconductor encapsulation of the present invention is not particularly limited, but the mixing proportion is preferably equal to or greater than 0.5% by mass and equal to or less than 12% by mass, and more preferably equal to or greater than 1% by mass and equal to or less than 9% by mass, relative to the total amount of the epoxy resin composition for semiconductor encapsulation. When the mixing proportion of the curing agent (B) is equal to or greater than the lower limit described above, the risk of causing a decrease in fluidity or the like is reduced. When the mixing proportion of the curing agent (B) is equal to or lower than the upper limit described above, the risk of causing a decrease in the resistance to solder or the like is reduced.

The equivalent ratio of the epoxy resin of the component (A) and the curing agent of the component (B), that is, the ratio of the number of epoxy groups in the epoxy resin (A)/the number of hydroxyl groups in the curing agent (B), is not particularly limited. However, in order to suppress the respective unreacted fractions of the components to a low level, the equivalent ratio is preferably set to the range of 0.5 to 2, and more preferably set to the range of 0.6 to 1.5. Furthermore, in order to obtain an epoxy resin composition for semiconductor encapsulation having excellent moldability and excellent resistance to reflow, the equivalent ratio is even more preferably set to the range of 0.8 to 1.2.

The inorganic filler material (C) that is used in the epoxy resin composition for semiconductor encapsulation of the present invention is incorporated into the epoxy resin composition for semiconductor encapsulation for a reduction of hygroscopicity, a decrease in the coefficient of linear expansion, an enhancement of thermal conductivity, and an enhancement of strength. Examples of this inorganic filler material include powders such as fused silica, crystalline silica, alumina, calcium silicate, calcium carbonate, potassium titanate, silicon carbide, silicon nitride, aluminum nitride, boron nitride, beryllia, zirconia, zircon, forsterite, steatite, spinel, mullite, and titania; beads obtained by spheroidizing these powders; and glass fiber. Furthermore, examples of inorganic filler materials having a flame retardant effect include aluminum hydroxide, magnesium hydroxide, zinc borate, and zinc molybdate. These inorganic filler materials may be used singly, or two or more kinds may be used in combination. Among the inorganic filler materials described above, fused silica is preferred from the viewpoint of decreasing the coefficient of linear expansion, and alumina is preferred from the viewpoint of high thermal conductivity. The shape of the filler material is preferably spherical in view of fluidity at the time of molding and mold abrasiveness.

The amount of incorporation of the inorganic filler material (C) is preferably in the range of equal to or greater than 80% by mass and equal to or less than 96% by mass, more preferably in the range of equal to or greater than 82% by mass and equal to or less than 92% by mass, and even more preferably in the range of equal to or greater than 86% by mass and equal to or less than 90% by mass, based on the epoxy resin composition for semiconductor encapsulation, from the viewpoints of moldability, hygroscopicity, a decrease in the coefficient of linear expansion, and an enhancement of strength. If the amount of incorporation is less than the lower limit, reliability tends to decrease, and if the amount of incorporation is greater than the upper limit, moldability tends to decrease.

The hydrocarbon compound having structures of formula (1) and formula (2) of the component (D) that is used in the epoxy resin composition for semiconductor encapsulation of the present invention is incorporated into the epoxy resin composition for semiconductor encapsulation for an enhancement of mold releasability. Examples of such a hydrocarbon compound include linear unsaturated hydrocarbon compounds such as 1-hexene, 2-hexene, 1,3-hexadiene, 1-octene, 2-octene, 3-octene, 1,3-octadiene, 1-decene, 2-decene, 3-decene, 4-decene, 1,3-decadiene, 1-octacosene, 1-triacontene, 1-hentriacontene, 1-dotriacontene, 1-tritriacontene, 1-tetratriacontene, 1-pentatriacontene, 1-hexatriacontene, 1-tetracontene, 1-hentetracontene, 1-dotetracontene, 1-tritetracontene, 1-tetratetracontene, 1-pentacontene, 1-henpentacontene, 1-dopentacontene, 1-tripentacontene, 1-pentapentacontene, and 1-hexacontene; and branched unsaturated hydrocarbons such as 3-methyl-1-triacontene, 3,4-dimethyltriacontene, 3-methyl-1-tetracontene, and 3,4-dimethyltetracontene. These may be used singly, or two or more kinds may be used in combination.

Among the unsaturated hydrocarbons described above, an alkene is preferred from the viewpoints of preservability and chemical stability, and from the viewpoint that voids do not easily occur in molded articles, an alkene having 10 or more carbon atoms is more preferred. From the viewpoint of mold releasability, a 1-alkene having 10 or more carbon atoms is even more preferred, a 1-alkene having 28 or more carbon atoms is still more preferred, and a 1-alkene having 28 to 60 carbon atoms is particularly preferred. If the carbon number of the 1-alkene is greater than the upper limit, there is a risk that the adhesiveness to copper lead frames that have undergone oxidation may be insufficient.

The mixing proportion of the component (D) used in the epoxy resin composition for semiconductor encapsulation of the present invention is not particularly limited, but the mixing proportion is preferably equal to or greater than 0.01 parts by mass and equal to or less than 0.1 parts by mass, and more preferably equal to or greater than 0.02 parts by mass and equal to or less than 0.04 parts by mass, relative to 100 parts by mass of the epoxy resin of the component (A). When the mixing proportion is equal to or greater than the lower limit described above, an effect of enhancing mold releasability is obtained. When the mixing proportion is equal to or less than the upper limit described above, the risk of causing a decrease in adhesiveness or the like is reduced.

There are no particular limitations on the hydrocarbon compound (E) having an ester group that is used in the epoxy resin composition for semiconductor encapsulation of the present invention, but examples include a compound obtained by semi-esterifying a copolymer of a 1-alkene and maleic anhydride with an aliphatic alcohol; and a montanic acid ester. These hydrocarbon compounds having an ester group may be used singly, or two or more kinds may be used in combination. The hydrocarbon compound (E) having an ester group has a high effect of dispersing the component (D) in the epoxy resin (A) or the curing agent (B), and when used in combination with the component (D), the hydrocarbon compound (E) is effective for an enhancement of the adhesive power to copper lead frames that have undergone oxidation, or an enhancement of mold releasability.

There are no particular limitations on the 1-alkene monomer that is used in the synthesis of the compound obtained by semi-esterifying a copolymer of a 1-alkene and maleic anhydride with a long-chain aliphatic alcohol, but examples include linear 1-alkenes such as 1-octacosene, 1-triacontene, 1-hentriacontene, 1-dotriacontene, 1-tritriacontene, 1-tetratriacontene, 1-pentatriacontene, 1-hexatriacontene, 1-tetracontene, 1-hentetracontene, 1-dotetracontene, 1-tritetracontene, 1-tetratetracontene, 1-pentacontene, 1-henpentacontene, 1-dopentacontene, 1-tripentacontene, 1-pentapentacontene, and 1-hexacontene; and branched 1-alkenes such as 3-methyl-1-triacontene, 3,4-dimethyltriacontene, 3-methyl-1-tetracontene, and 3,4-dimethyltetracontene. These may be used singly, or two or more kinds may be used in combination. The carbon number of the 1-alkene monomer used in the synthesis of the compound obtained by semi-esterifying a copolymer of a 1-alkene and maleic anhydride with a long-chain aliphatic alcohol is preferably 5 to 60 from the viewpoint of the adhesiveness to copper lead frames that have undergone oxidation, and the carbon number is more preferably 28 to 60 from the viewpoint of continuous moldability (mold releasability).

There are no particular limitations on the long-chain aliphatic alcohol that is used in the synthesis of the compound obtained by semi-esterifying a copolymer of a 1-alkene and maleic anhydride with a long-chain aliphatic alcohol, but examples include linear or branched aliphatic saturated alcohols such as decyl alcohol, undecyl alcohol, lauryl alcohol, tridecyl alcohol, myristyl alcohol, pentadecyl alcohol, cetyl alcohol, heptadecyl alcohol, stearyl alcohol, nonadecyl alcohol, and eicosyl alcohol; and linear or branched aliphatic unsaturated alcohols such as hexenol, 2-hexen-1-ol, 1-hexen-3-ol, pentenol, and 2-methyl-1-pentenol. These may be used singly, or two or more kinds may be used in combination. Among these, a linear alcohol having 10 to 25 carbon atoms is preferred from the viewpoint of the mold release load, and a linear aliphatic saturated alcohol having 15 to 20 carbon atoms is more preferred from the viewpoint of continuous moldability. If the carbon number of the long-chain aliphatic alcohol used in the synthesis of a compound obtained by semi-esterifying a copolymer of a 1-alkene and maleic anhydride with a long-chain aliphatic alcohol is less than the lower limit, continuous moldability (releasability) is deteriorated, and if the carbon number is greater than the upper limit, the adhesiveness to copper lead frames that have undergone oxidation is decreased.

There are no particular limitations on the copolymer of a 1-alkene and maleic anhydride used in the synthesis of the component (E) of the present invention, but examples include a compound represented by formula (7) and a compound represented by formula (8). Commercially marketed products that are available include DIACARNA (registered trademark) 30 (manufactured by Mitsubishi Chemical Corp., trade name), which uses 1-octacosene, 1-triacontene, 1-tetracontene, 1-pentacontene, 1-hexacontene and the like as raw materials.

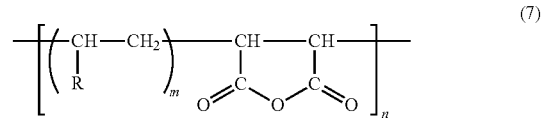

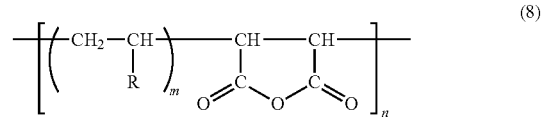

R in the formulae (7) and (8) represents an aliphatic hydrocarbon group having 3 to 58 carbon atoms, and n represents an integer of 1 or greater. m represents the copolymerization ratio of the 1-alkene and maleic anhydride and is not particularly limited. However, when X moles of the 1-alkene and Y moles of maleic anhydride are used, the ratio X/Y, that is, m, is preferably 1/2 to 10/1, and the ratio is more preferably approximately 1/1, which is almost equimolar.

There are no particular limitations on the method for producing a copolymer of a 1-alkene and maleic anhydride, and any general copolymerization method of allowing raw materials to react can be used. In the reaction, an organic solvent capable of dissolving a 1-alkene and maleic anhydride may be used. The organic solvent is not particularly limited, but toluene is preferred, and an aromatic solvent, an ether-based solvent, a halogen-based solvent or the like can also be used. The reaction temperature may vary depending on the type of the organic solvent used, but from the viewpoints of reactivity and productivity, the reaction temperature is preferably set to 50° C. to 200° C., and more preferably set to 100° C. to 150° C. The reaction time is not particularly limited as long as a copolymer may be obtained, but from the viewpoint of productivity, the reaction time is preferably set to 1 hour to 30 hours, more preferably 2 hours to 15 hours, and even more preferably 4 hours to 10 hours. After completion of the reaction, if necessary, unreacted components, the solvent and the like can be removed by heating under reduced pressure or the like. The conditions are preferably set to a temperature of 100° C. to 220° C., and more preferably 120° C. to 180° C., a pressure of $13.3 \times 10^3$ Pa or less, and more preferably $8 \times 10^3$ Pa or less, and a time of 0.5 hours to 10 hours. Furthermore, in the reaction, a radical polymerization initiator such as azobisisobutyronitrile (AIBN) or benzoyl peroxide (BPO) may also be added as necessary.

There are no particular limitations on the method of esterifying a copolymer of a 1-alkene and maleic anhydride with a long-chain aliphatic alcohol, and any general technique of subjecting the copolymer to an addition reaction with the alcohol may be used. The reaction molar ratio of the copolymer of a 1-alkene and maleic anhydride and the alcohol is not particularly limited and can be arbitrarily set. However, when this reaction molar ratio is adjusted, the degree of hydrophilicity can be controlled. Therefore, it is preferable to appropriately set the reaction molar ratio in accordance with the intended epoxy resin composition for encapsulation. In the reaction, an organic solvent which is capable of dissolving a 1-alkene and maleic anhydride may also be used. There are no particular limitations on the organic solvent, but toluene is preferred, and an aromatic solvent, an ether-based solvent, a halogen-based solvent, or the like can also be used. The reaction temperature may vary depending on the type of the organic solvent used, but from the viewpoints of reactivity and productivity, the reaction temperature is preferably set to 50° C. to 200° C., and more preferably 100° C. to 150° C. The reaction time is not particularly limited as long as a copolymer may be obtained, but from the viewpoint of productivity, the reaction time is preferably set to 1 hour to 30 hours, more preferably 2 hours to 15 hours, and even more preferably 4 hours to 10 hours. After completion of the reaction, if necessary, unreacted components, the solvent and the like can be removed by heating under reduced pressure or the like. The conditions are preferably set to a temperature of 100° C. to 220° C., and more preferably 120° C. to 180° C., a pressure of $13.3 \times 10^3$ Pa or less, and more preferably $8 \times 10^3$ Pa or less, and a time of 0.5 hours to 10 hours. Furthermore, in the reaction, a reaction catalyst, such as an amine-based catalyst such as triethylamine or N,N-dimethylaminopyridine; or an acid catalyst such as sulfuric acid or para-toluenesulfonic acid, may also be added as necessary.

Examples of the compound obtained by esterifying a copolymer of a 1-alkene and maleic anhydride with a long-chain aliphatic alcohol, include a diester represented by the following formula (a) or (b), and a compound containing one or more selected from monoesters represented by formulae (c) to (f) as repeating units. These compounds may further contain a non-ester represented by formula (g) or (h). As such a compound, the main chain skeleton contains (1) anyone of (a) to (f); (2) any two or more kinds of (a) to (f) in a random fashion, in a regular fashion, or in a block form; or (3) any one kind or two or more kinds of (a) to (f) and (g), and/or (h) in a random fashion, in a regular fashion, or in a block form. Such compounds may be used singly, or two or more kinds may be used in combination. Furthermore, the main chain skeleton may also contain (4) a compound containing (g) and (h) in a random fashion, in a regular fashion, or in a block form, and/or (5) a compound composed of any one of (g) or (h). The esterification ratio of the compound obtained by esterifying a copolymer of a 1-alkene and maleic anhydride with a long-chain aliphatic alcohol, is preferably adjusted to 20 mol % or higher from the viewpoints of mold releasability and adhesiveness. The compound obtained by esterifying a copolymer of a 1-alkene and maleic anhydride with a long-chain aliphatic alcohol is preferably a compound containing any one kind or two or more kinds of the monoesters represented by the formulae (c) to (f) in an amount of 20% by mole or more in total, and more preferably in an amount of 30% by mole or more.

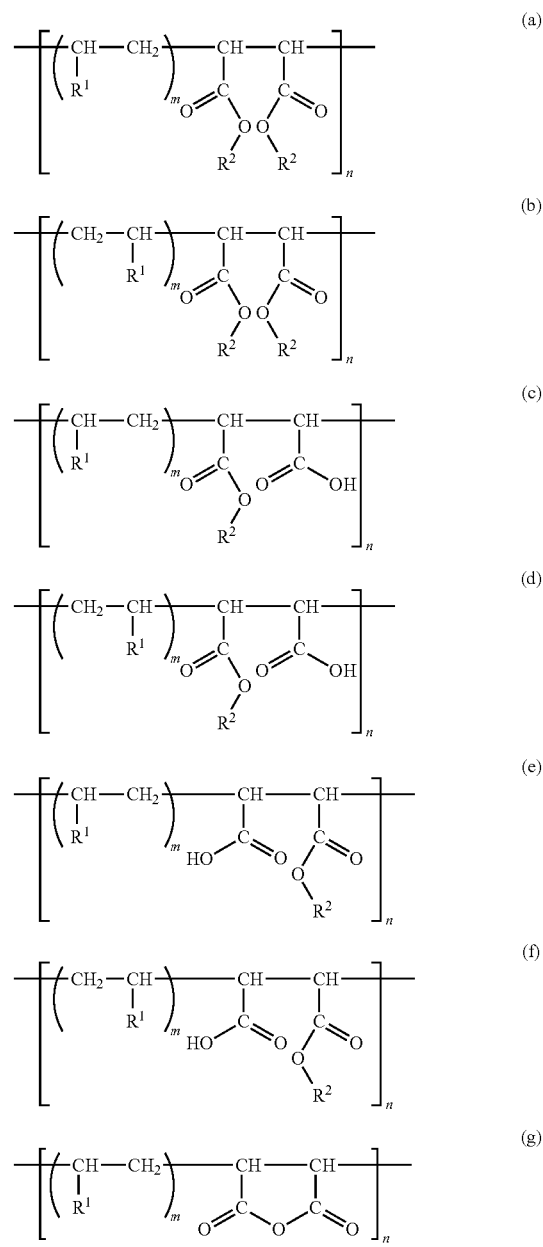

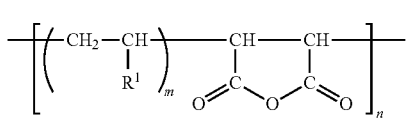

$R^1$ in the formulae (a) to (h) represents an aliphatic hydrocarbon group having 3 to 58 carbon atoms; $R^2$ represents a hydrocarbon group having 10 to 25 carbon atoms; m represents the copolymerization molar ratio X/Y of the 1-alkene (X) and maleic anhydride (Y), and m is preferably 1/2 to 10/1, and more preferably approximately 1/1.

The number average molecular weight of the compound obtained by esterifying a copolymer of a 1-alkene and maleic anhydride with a long-chain aliphatic alcohol, is not particularly limited as long as there are one or more repeating units. A balance between the adhesiveness to copper lead frames that have undergone oxidation and mold releasability can be realized in any molecular weight region when the compound is used in combination with the component (D), but preferably, the number average molecular weight is 2,000 to 10,000.

The amount of incorporation of the compound obtained by esterifying a copolymer of a 1-alkene and maleic anhydride with a long-chain aliphatic alcohol is not particularly limited, but the amount of incorporation is preferably equal to or greater than 0.5 parts by mass and equal to or less than 10 parts by mass, and more preferably equal to or greater than 1 part by mass and equal to or less than 5 parts by mass, relative to 100 parts by mass of the epoxy resin of the component (A). If the amount of incorporation is less than the lower limit, mold releasability tends to decrease, and if the amount of incorporation is greater than the upper limit, the adhesiveness to copper lead frames that have undergone oxidation tends to be insufficient.

Examples of the montanic acid ester include montanic acid ester waxes, and partial saponification products of montanic acid ester waxes. With regard to the montanic acid ester, montanic acid esterification products obtained by subjecting montanic acid and diol compounds such as ethylene glycol and butylene glycol, or triol compounds such as glycerin, to a dehydration condensation reaction; mixtures of the montanic acid esterification products and calcium saponification products thereof; and the like are commercially available in an industrial scale. Among these, from the viewpoint of the adhesiveness to copper oxide, ethylene glycol dimontanic acid ester and glycerin trimontanic acid ester are preferred. As for these compounds, LICOWAX (registered trademark) E and LICOLUB (registered trademark) WE4 (all manufactured by Clariant International AG, trade names) are available as commercial products.

The total amount of incorporation of the component (D) and the component (E) in the epoxy resin composition for semiconductor encapsulation of the present invention is not particularly limited, but the total amount of incorporation is equal to or greater than 0.5 parts by mass and equal to or less than 10 parts by mass, and more preferably equal to or greater than 1 part by mass and equal to or less than 5 parts by mass, relative to 100 parts by mass of the epoxy resin of the component (A). If the amount of incorporation is less than the lower limit, mold releasability tends to decrease, and if the amount of incorporation is greater than the upper limit, the adhesiveness to copper lead frames that have undergone oxidation tends to be insufficient.

The mixing ratio of the component (D) and the component (E) is preferably 1:4 to 1:20. If the amount of incorporation of the component (D) is larger than the range described above, the component (D) does not sufficiently disperse in the epoxy resin composition, contamination of the package surface is worsened, and the adhesiveness to copper lead frames that have undergone oxidation tends to decrease. If the amount of incorporation of the component (D) is less than the range described above, continuous moldability tends to deteriorate.

The epoxy resin composition for semiconductor encapsulation of the present invention may further contain a curing accelerator. Any curing accelerator that is generally used in epoxy resin composition for semiconductor encapsulation can be used without particular limitations, but examples thereof include cycloamidine compounds such as 1,8-diazabicyclo(5,4,0)undecene-7, 1,5-diazabicyclo(4,3,0)nonene, and 5,6-dibutylamino-1,8-diazabicyclo(5,4,0)undecene-7; tertiary amine compounds and derivatives thereof, such as benzyldimethylamine, triethanolamine, dimethylaminoethanol, and tris(dimethylaminomethyl)phenol; imidazole compounds and derivatives thereof, such as 2-methylimidazole, 2-phenylimidazole, and 2-phenyl-4-methylimidazole; organic phosphines such as tributylphosphine, methyldiphenylphosphine, triphenylphosphine, tris(4-methylphenyl)phosphine, diphenylphosphine, and phenylphosphine; organophosphorus compounds, such as compounds having intramolecular polarization obtained by adding quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, and phenyl-1,4-benzoquinone, or compounds having it bonds, such as bisphenol A, bisphenol F, bisphenol S, and phenolic resins, to those organic phosphines; and tetraphenylborates and derivatives thereof, such as tetraphenylphosphonium tetraphenylborate, and triphenylphosphine tetraphenylborate. These may be used singly, or two or more kinds may be used in combination. Among them, organophosphorus compounds are preferred from the viewpoint of moldability. Organic phosphines, and adducts of organic phosphines and quinone compounds are more preferred, while triphenylphosphine, and adducts of tertiary phosphines such as triphenylphosphine, tris(4-methylphenyl)phosphine and tris(4-methoxyphenyl)phosphine with quinone compounds such as p-benzoquinone and 1,4-naphthoquinone, are even more preferred.

The amount of incorporation of the curing accelerator is not particularly limited as long as it is an amount capable of achieving a curing accelerating effect, but the amount of incorporation is preferably equal to or greater than 0.1 parts by mass and equal to or less than 10 parts by mass, and more preferably equal to or greater than 1 part by mass and equal to or less than 5 parts by mass, relative to 100 parts by mass of the epoxy resin (A). If the amount of incorporation is less than the lower limit, short-time curability tends to deteriorate, and if the amount of incorporation is greater than the upper limit, there is a tendency that the curing rate is so fast that it may be difficult to obtain satisfactory molded articles due to non-filling or the like.

In the epoxy resin composition for semiconductor encapsulation of the present invention, a siloxane addition polymer can be added for the purpose of obtaining an epoxy resin composition having satisfactory resistance to solder stress and satisfactory fluidity. There are no particular limitations on the siloxane addition polymer, and any conventionally known polymers can be used, but for example, a modified silicone oil in which some of the methyl substituents of dimethylsiloxane are substituted with substituents such as an alkyl group, an epoxy group, a carboxyl group, and an amino group, may be used.

The siloxane addition polymer modification products can be used singly or as mixtures of two or more kinds, and can be used at a proportion of equal to or greater than 0.1% by mass and equal to or less than 2% by mass relative to the total amount of the epoxy resin composition. If the amount of incorporation is greater than the upper limit, surface contamination is prone to occur, and there is a risk that resin bleed may become longer. If the amount of incorporation is less than the lower limit, there is a problem that a sufficiently low elastic modulus and dispersibility of the releasing agent may not be achieved.

In the epoxy resin composition for semiconductor encapsulation of the present invention, an anion exchanger may also be added from the viewpoint of enhancing the moisture resistance and high temperature storage characteristics of semiconductor elements such as IC. There are no particular limitations on the anion exchanger, and any conventionally known anion exchangers can be used. However, examples thereof include hydrotalcite, and hydrous oxides of elements selected from antimony, bismuth, zirconium, titanium, tin, magnesium and aluminum, and these can be used singly or in combination of two or more kinds. Among them, a hydrotalcite represented by the following formula (9) and bismuth hydrous oxide are preferred.

$$Mg_{1-x}Al_x(OH)_2(CO_3)_{X/2}\cdot mH_2O \qquad (9)$$

wherein in the formula (9), $0<X\leq 0.5$; and m represents a positive integer.

The amount of incorporation of the anion exchanger is not particularly limited as long as it is an amount sufficient to capture ionic impurities such as halogen ions, but the amount of incorporation is preferably equal to or greater than 0.1 parts by mass and equal to or less than 30 parts by mass, more preferably equal to or greater than 1 part by mass and equal to or less than 10 parts by mass, and even more preferably equal to or greater than 2 parts by mass and equal to or less than 5 parts by mass, relative to 100 parts by mass of the epoxy resin (A). If the amount of incorporation is less than the lower limit, the capture of ionic impurities tends to be insufficiently achieved. If the amount of incorporation is greater than the upper limit, there is no significant difference in the effect as compared with a smaller amount of incorporation, and therefore, it is economically disadvantageous.

In the epoxy resin composition for semiconductor encapsulation of the present invention, known coupling agents such as various silane compounds such as epoxysilane, mercaptosilane, aminosilane, alkylsilane, ureidosilane and vinylsilane; titanium-based compounds, aluminum chelates, and aluminum/zirconium-based compounds can be added if necessary, in order to increase the adhesiveness between the resin component and the inorganic filler material. Examples of these coupling agents include silane coupling agents such as vinyltriethoxysilane, vinyltris (β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, γ-glycidoxypropyltriethoxysilane, vinyltriacetoxysilane, γ-mercaptopropyltrimethoxysilane, γ-mercaptopropylmethyldimethoxysilane, γ-mercaptopropyltriethoxysilane, γ-aminopropyltrimethoxysilane, γ-aminopropylmethyldimethoxysilane, γ-aminopropyltriethoxysilane, γ-anilinopropyltrimethoxysilane, γ-anilinopropylmethyldimethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylendiamine, N-β-(N-vinylbenzylaminoethyl)-γ-aminopropyltrimethoxysilane, γ-chloropropyltrimethoxysilane, hexamethyldisilane, and vinyltrimethoxysilane; and titanate coupling agents such as isopropyltriisostearoyl titanate, isopropyltris(dioctyl pyrophosphate) titanate, isopropyltri(N-aminoethyl-aminoethyl) titanate, tetraoctylbis(ditridecyl phosphite) titanate, tetra(2,2-diallyloxymethyl-1-butyl)bis(ditridecyl)phosphite titanate, bis(dioctyl pyrophosphate) oxyacetate titanate, bis(dioctyl pyrophosphate) ethylene titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctyl phosphate) titanate, isopropyltricumylphenyl titanate, and tetraisopropylbis (dioctyl phosphite) titanate. These may be used singly, or two or more kinds may be used in combination.

The amount of incorporation of the coupling agent is preferably equal to or greater than 0.05 parts by mass and equal to or less than 5 parts by mass, and more preferably equal to or greater than 0.1 parts by mass and equal to or less than 2.5 parts by mass, relative to 100 parts by mass of the inorganic filler material (C). If the amount of incorporation is less than the lower limit, moisture resistance tends to decrease, and if the amount of incorporation is larger than the upper limit, moldability of the package tends to decrease.

Furthermore, in the epoxy resin composition for semiconductor encapsulation of the present invention, known organic or inorganic compounds containing a halogen atom, an antimony atom, a nitrogen atom or a phosphorus atom, such as brominated epoxy resins, antimony trioxide, antimony tetroxide, and antimony pentoxide; flame retardants such as metal hydroxides; colorants such as carbon black, organic dyes, organic pigments, titanium oxide, red lead, and red iron oxide; imidazoles, triazoles, tetrazoles, triazines and the like, and derivatives thereof; anthranilic acid, gallic acid, malonic acid, malic acid, maleic acid, aminophenol, quinoline and the like, and derivatives thereof; and adhesion accelerators such as aliphatic acid amide compounds, dithiocarbamic acid salts, and thiadiazole derivatives, can be incorporated if necessary, as other additives.

The epoxy resin composition for semiconductor encapsulation of the present invention can be prepared by using any technique, as long as various raw materials can be uniformly dispersed and mixed. However, as a common technique, a method of sufficiently mixing predetermined amounts of incorporation of raw materials by using a mixer or the like, subsequently melt kneading the raw materials using a mixing roll, a kneader, an extruder or the like, and then cooling and pulverizing the kneading product, may be used. The kneading product can be used with more ease, if the kneading product is produced into tablets having a dimension and a mass appropriate for the molding conditions.

Furthermore, the epoxy resin composition for semiconductor encapsulation of the present invention can also be dissolved in various organic solvents and used as a liquid epoxy resin composition for semiconductor encapsulation, and can also be used as a sheet-like or film-like epoxy resin composition for semiconductor encapsulation, which is obtainable by thinly applying the liquid epoxy resin composition for semiconductor encapsulation onto a plate or a film, and scattering an organic solvent under the conditions such that the curing reaction of the resin would not proceed too much.

Next, the semiconductor device of the present invention will be explained. The semiconductor device of the present invention can be obtained by encapsulating a semiconductor element with the epoxy resin composition for semiconductor encapsulation of the present invention. Such a semiconductor device may be a semiconductor device in which an element, such as an active element such as a semiconductor chip, a transistor, a diode or a thyristor, or a passive element such as a condenser, a resistor or a coil, is mounted on the supporting member of a copper lead frame, and necessary parts of the element are encapsulated with the epoxy resin composition for semiconductor encapsulation of the present invention. Furthermore, examples of such a semiconductor device include general resin-encapsulated IC's such as DIP (Dual Inline Package), PLCC (Plastic Leaded Chip Carrier), QFP (Quad Flat Package), SOP (Small Outline Package), SOJ (Small Outline J-lead Package), TSOP (Thin Small Outline Package), and TQFP (Thin Quad Flat Package), which are obtained by fixing a semiconductor element onto a copper lead frame, connecting the terminal of the element such as a bonding pad to a lead unit by wire bonding or bumping, and then encapsulating the element using the epoxy resin composition for semiconductor encapsulation of the present invention by transfer molding or the like. Furthermore, semiconductor packages in which semiconductor chips are laminated in multiple layers, such as MCP (Multi Chip Stacked Package), may also be used.

FIG. 1 is a diagram illustrating the cross-sectional structure of an example of a semiconductor device which uses an epoxy resin composition for semiconductor encapsulation according to the present invention. In FIG. 1, a semiconductor element 1 is laminated in two layers and fixed onto a die pad 3 through a die bond material cured product 2. The electrode pad of the semiconductor element 1 is connected to a lead frame 5 through gold wires 4. The semiconductor element 1 is encapsulated by a cured product 6 of the resin composition for encapsulation.

As the method of encapsulating an element by using the epoxy resin composition for semiconductor encapsulation of the present invention, a low pressure transfer molding method is most commonly used, but an injection molding method, a compression molding method and the like may also be used. When the epoxy resin composition for semiconductor encapsulation is in a liquid form or a paste form at normal temperature, a dispensing method, a casting method, a printing method and the like may be used.

Furthermore, there are available not only a general encapsulation method of directly encapsulating an element with a resin, but also a hollow packaging method in which the epoxy resin composition for semiconductor encapsulation is not brought into direct contact with an element. Thus, the epoxy resin composition can also be suitably used as an epoxy resin composition for semiconductor encapsulation for hollow packaging.

EXAMPLES

Hereinafter, the present invention will be described in detail by way of Examples, but the present invention is not intended to be limited to these by any means.

Synthesis Example 1

Synthesis of Compound (E) Obtained by Esterifying Copolymer of 1-alkene Having 28 to 60 Carbon Atoms and Maleic Anhydride with Alcohol Having 18 Carbon Atoms 300 g of a copolymer of a mixture of 1-octacosene, 1-triacontene, 1-tetracontene, 1-pentacontene, 1-hexacontene and the like and maleic anhydride (trade name: DIACARNA (registered trademark) 30 manufactured by Mitsubishi Chemical Corp.) and 140 g of stearyl alcohol were dissolved in 500 ml of toluene, and the solution was allowed to react for 8 hours at 110° C. Subsequently, toluene was removed while the temperature was increased stepwise up to 160° C., and unreacted components were removed by carrying out the reaction for 6 hours at 160° C. under reduced pressure. Thus, 1,489 g of the target compound having a monoesterification ratio of 100% by mole was obtained. The molecular weight was measured by gel permeation chromatography by using tetrahydrofuran as an eluent, and calculated relative to polystyrene standards. The number average molecular weight (Mn) was 4,100, the molecular weight distribution (Mw/Mn) was 3.52, and the residual amount of unreacted stearyl alcohol was 1% or less of the total amount of the compound 1.

Synthesis Example 2

Synthesis of Compound (E) Obtained by Esterifying Copolymer of 1-alkene Having 28 to 60 Carbon Atoms and Maleic Anhydride with Alcohol Having 10 Carbon Atoms 2,378 g of a compound having a monoesterification ratio of 100% by mole was obtained by the method described in Synthesis Example 1, except that 82 g of 1-decanol (manufactured by Tokyo Chemical Industry Co., Ltd.) was used instead of stearyl alcohol. The molecular weight was measured by gel permeation chromatography by using tetrahydrofuran as an eluent, and calculated relative to polystyrene standards. The number average molecular weight (Mn) was 3,700, the molecular weight distribution (Mw/Mn) was 3.71, and the residual amount of unreacted 1-decanol was 1% or less of the total amount of the compound 2.

Synthesis Example 3

Synthesis of Compound (E) Obtained by Esterifying Copolymer of 1-alkene Having 28 to 60 Carbon Atoms and Maleic Anhydride with Alcohol Having 22 Carbon Atoms 3,458 g of a compound having a monoesterification ratio of 100% by mole was obtained by the method described in Synthesis Example 1, except that 170 g of behenyl alcohol (trade name: KALCOL 220-80 manufactured by Kao Corp.) was used instead of stearyl alcohol. The molecular weight was measured by gel permeation chromatography by using tetrahydrofuran as an eluent, and calculated relative to polystyrene standards. The number average molecular weight (Mn) was 4,400, the molecular weight distribution (Mw/Mn) was 3.55, and the residual amount of unreacted behenyl alcohol was 1% or less of the total amount of the compound 3.

Synthesis Example 4

Synthesis of Compound (E) Obtained by Esterifying Copolymer of 1-alkene Having 28 to 60 Carbon Atoms and Maleic Anhydride with Alcohol Having 8 Carbon Atoms 4,340 g of a compound having a monoesterification ratio of 100% by mole was obtained by the method described in Synthesis Example 1, except that 68 g of 1-octanol (manufactured by Tokyo Chemical Industry Co., Ltd.) was used instead of stearyl alcohol. The molecular weight was measured by gel permeation chromatography by using tetrahydrofuran as an eluent, and calculated relative to polystyrene standards. The number average molecular weight (Mn) was 3,700, the molecular weight distribution (Mw/Mn) was 3.80, and the residual amount of unreacted 1-octanol was 1% or less of the total amount of the compound 4.

Synthesis Example 5

Synthesis of Compound (E) Obtained by Esterifying Copolymer of 1-alkene Having 28 to 60 Carbon Atoms and Maleic Anhydride with Alcohol Having 28 Carbon Atoms 5,506 g of a compound having a monoesterification ratio of 100% by mole was obtained by the method described in Synthesis Example 1, except that 214 g of octacosanol (trade name: POLICOSANOL (derived from rice bran) manufactured by Functional Material Laboratory Co., Ltd.) was added instead of stearyl alcohol. The molecular weight was measured by gel permeation chromatography by using tetrahydrofuran as an eluent, and calculated relative to polystyrene standards. The number average molecular weight (Mn) was 4,800, the molecular weight distribution (Mw/Mn) was 3.91, and the residual amount of unreacted octacosanol was 1% or less of the total amount of the compound 5.

Synthesis Example 6

Synthesis of Compound Obtained by Esterifying Copolymer of 1-alkene Having 20 to 24 Carbon Atoms and Maleic Anhydride with Alcohol Having 18 Carbon Atoms 180 g of a mixture of 1-eicosene, 1-docosene and 1-tetracosene (trade name: LINEAREN 2024 manufactured by Idemitsu Kosan Co., Ltd.) and 58 g of maleic anhydride were dissolved in 500 ml of toluene, and 0.16 g of BPO was added thereto in three divided portions at an interval of 20 minutes while the solution was heated at 110° C. After completion of the addition of BPO, the reaction solution was further heated at 110° C. for 7 hours. 162 g of stearyl alcohol was added to this toluene solution of a copolymer, and the mixture was allowed to react for 8 hours at 110° C. Subsequently, toluene was removed while the temperature was increased stepwise up to 160° C., and unreacted components were removed by carrying out the reaction for 6 hours at 160° C. under reduced pressure. Thus, 6,380 g of a target compound having a monoesterification ratio of 100% by mole was obtained. The molecular weight was measured by gel permeation chromatography by using tetrahydrofuran as an eluent, and calculated relative to polystyrene standards. The number average molecular weight (Mn) was 9,800, the molecular weight distribution (Mw/Mn) was 2.63, and the residual amount of unreacted stearyl alcohol was 1% or less of the total amount of the compound 6.

The components used in Examples 1 to 14 and Comparative Examples 1 to 8 will be listed below.

Epoxy Resin (A):
Epoxy resin 1: Biphenyl type epoxy resin having an epoxy equivalent of 185 and a melting point of 108° C. (trade name: EPIKOTE YX-4000K manufactured by Japan Epoxy Resins Co., Ltd.)
Epoxy resin 2: Phenol-aralkyl type epoxy resin having a phenylene skeleton and having an epoxy equivalent of 237 and a softening point of 52° C. (trade name: NC2000 manufactured by Nippon Kayaku Co., Ltd.)
Epoxy resin 3: Phenol-aralkyl type epoxy resin having a biphenylene skeleton and having an epoxy equivalent of 273 and a softening point of 52° C. (trade name: NC-3000L manufactured by Nippon Kayaku Co., Ltd.)
Epoxy resin 4: Ortho-cresol-novolac type epoxy resin having an epoxy equivalent of 220 and a softening point of 52° C. (trade name: EOCN-104S manufactured by Nippon Kayaku Co., Ltd.)

Curing Agent (B):
Phenolic resin 1: Phenol-aralkyl type phenolic resin having a biphenylene skeleton and having a hydroxyl group equivalent of 199 and a softening point of 64° C. (trade name: MEH-7851SS manufactured by Meiwa Plastic Industries, Ltd.)

Inorganic Filler Material (C):
Inorganic filler material 1: Spherical fused silica having an average particle size of 10.8 μm and a specific surface area of 5.1 m²/g Hydrocarbon compound (D) having structures of formula (1) and formula (2):
1-Alkene (C28-60): trade name: ALPHA OLEFIN C30+ manufactured by Chevron Phillips Chemical Company
1-Alkene (C20-24): trade name: LINEAREN 2024 manufactured by Idemitsu Kosan Co., Ltd.
1-Alkene (C10): trade name: 1-DECENE manufactured by Tokyo Chemical Industry Co., Ltd.

Hydrocarbon compound (E) having ester group:
Compound 1 obtained in Synthesis Example 1
Compound 2 obtained in Synthesis Example 2
Compound 3 obtained in Synthesis Example 3
Compound 4 obtained in Synthesis Example 4
Compound 5 obtained in Synthesis Example 5
Compound 6 obtained in Synthesis Example 6
Montanic acid-based wax: trade name: LICOWAX E manufactured by Clariant International AG Other Releasing Agent:
Polyethylene oxide wax: trade name: PED191 manufactured by Clariant International AG.

Other Additives:
Curing accelerator 1: Adduct of triphenylphosphine and p-benzoquinone
Coupling agent 1: γ-glycidoxypropyltrimethoxysilane (trade name: S510=GPS-M manufactured by Chisso Corp.)
Colorant 1: Carbon black (trade name: CARBON #5 manufactured by Mitsubishi Chemical Corp.)

The components described above were respectively mixed at proportions corresponding to the parts by mass indicated in Table 1 and Table 2, the mixture was subjected to twin-screw kneading under the conditions of a kneading temperature of 100° C. and a kneading time of 30 minutes, and the kneading product was cooled and then pulverized. Thus, epoxy resin compositions for semiconductor encapsulation were prepared.

The epoxy resin compositions for semiconductor encapsulation of Examples and Comparative Examples thus prepared were evaluated by the following respective tests. The evaluation results are presented in Table 1 and Table 2.

(1) Adhesive Strength to Copper Oxide:
A copper oxide base material and a tabletted epoxy resin composition were subjected to integral molding under the conditions of 175° C. and 6.9 MPa for 2 minutes, and thus a molded article having a circular truncated cone shape (upper diameter 3 mm×lower diameter 3.6 mm×thickness 3 mm, contact area between the copper oxide base material and the resin cured product: 10 mm²) on a copper oxide base material (diameter: 3.6 mm, thickness: 0.5 mm) was obtained. Subsequently, the base material of each molded article thus obtained was fixed, the cured site of the epoxy resin composition was pressed from a horizontal direction, and the torque (N) was measured. This evaluation is correlated to the resistance to solder reflow in the semiconductor to some extent, and as the determination results, a torque of 14 N or greater was indicated as ⊙, a torque of equal to or greater than 12 N and less than 14 N was indicated as ○, while a torque of less than 12 N was indicated as x.

(2) Mold Release Load

Figure 2:
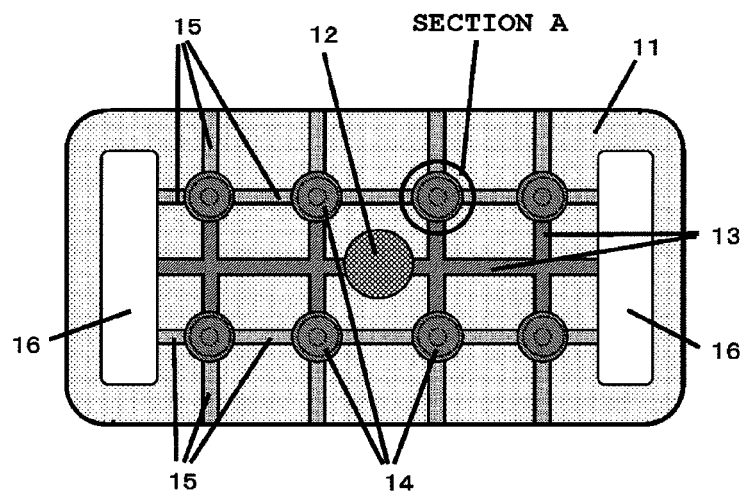
FIG. 2 is a schematic plan diagram illustrating a middle mold after molding with a mold for evaluation for evaluating the load upon mold release of the epoxy resin composition for semiconductor encapsulation according to the present invention.
Figure 3:
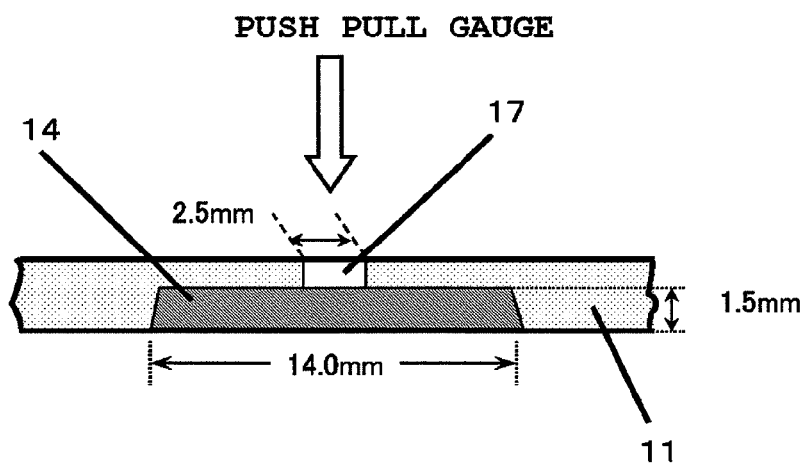
FIG. 3 is a schematic diagram illustrating the cross-sectional structure of section A near the molded article of the middle mold illustrated in FIG. 2.

A mold for an evaluation of load at the time of mold release is composed of an upper mold, a middle mold, and a lower mold as a transfer molding mold. FIG. 2 is a schematic plan diagram of the middle mold after molding. The shape of the molded article attached to the middle mold after molding has a diameter of 14.0 mm and a height of 1.5 mm. In FIG. 2, reference numeral 11 represents the middle mold, 12 represents a cull, and 13 represents a runner. Reference numeral 14 represents a molded article, and 15 represents an air vent. Reference numeral 16 represents a grip. Furthermore, the cross-sectional structure of section A of the molded article of the middle mold of FIG. 2 is illustrated in FIG. 3. Reference numeral 17 represents a hole for insertion of a push pull gauge.

A material for evaluation was transfer molded by using the mold for an evaluation of load at the time of mold release, at a mold temperature of 175° C. and an injection pressure of 6.9 MPa for a curing time of 1 minute. After molding, a push pull gauge was stuck into the circular molded article 14 attached to the middle mold 11 through the hole 17 on top of the middle mold (see FIG. 3), and the load exerted when the molded article is projected was measured. Subsequently, the material for evaluation was shot molded into 20 articles, and then a latter half of them, that is, ten shot molded articles were analyzed. The average value of the measurements was indicated as the mold release load. The evaluation was correlated to stable productivity in massive molding to some extent, and as the determination results, a load of 12 N or less was indicated as ⊙, a load of greater than 12 N and equal to or less than 15 N was indicated as ○, while a load of greater than 15 N was indicated as x.

(3) Continuous Moldability (Mold Contamination, Package Contamination, and Air Vent Blockage):

An 80-pin quad flat package (80pQFP; a lead frame made of copper, outer dimension of package: 14 mm×20 mm×2 mm in thickness, pad size: 6.5 mm×6.5 mm, chip size: 6.0 mm×6.0 mm×0.35 mm in thickness) was continuously encapsulation-molded up to 400 shots by using an automatic low pressure transfer molding machine (manufactured by Dai-ichi Seiko Co., Ltd., GP-ELF), at a mold temperature of 175° C. and an injection pressure of 9.8 MPa for a curing time of 70 seconds.

In regard to mold contamination, the mold was observed after 400-shot molding, and the mold contamination was evaluated on the basis of the following 5-grade criteria, in terms of the degree of the state of contamination spreading from the gate opening. A preferred order is the order of A, B, C and so on, but a grade of C or higher is considered practically usable.

A: No contamination
B: Spreading of contamination is 20% by area or less of the cavity surface.
C: Spreading of contamination is greater than 20% by area and equal to or less than 40% by area of the cavity surface.
D: Spreading of contamination is greater than 40% by area and equal to or less than 60% by area of the cavity surface.
E: Spreading of contamination is greater than 60% by area of the cavity surface.

In regard to package contamination, the package of the $400^{th}$ shot was observed and evaluated on the basis of the following 5-grade criteria, in terms of the degree of the state of contamination spreading from the gate opening. A preferred order is the order of A, B, C and so on, but a grade of C or higher is considered practically usable.

A: No contamination
B: Spreading of contamination is 20% by area or less of the package surface.
C: Spreading of contamination is greater than 20% by area and equal to or less than 40% by area of the package surface.
D: Spreading of contamination is greater than 40% by area and equal to or less than 60% by area of the package surface.
E: Spreading of contamination is greater than 60% by area of the package surface.

In Examples 1 to 14, an evaluation of air vent blockage was also carried out. In the evaluation of air vent blockage, the presence or absence of air vent blockage (the state in which a resin cured product adheres to the air vent section (width: 0.5 mm, thickness: 50 µm) and blocks the air vent) was checked by observing the mold after every 50 shots by visual inspection, and the air vent blockage was evaluated on the basis of the following 4-grade criteria. A preferred order is the order of A, B, C and so on, but a grade of C or higher is considered practically usable. The evaluation results are presented below.

A: No problem up to 400 shots
B: Air vent blockage occurred within 300 shots.
C: Air vent blockage occurred within 200 shots.
D: Air vent blockage occurred within 100 shots.

Examples that were rated as A in the evaluation results: Examples 1, 2 and 10
Examples that were rated as B in the evaluation results: Examples 3, 6, 7, 8, 9 and 12
Examples that were rated as C in the evaluation results: Examples 4, 5, 11, 13 and 14
Examples that were rated as D in the evaluation results: None (4) Solder Resistance Test A 80pQFP semiconductor device (a lead frame made of Cu, size: 14×20 mm×2.00 mm in thickness, semiconductor element: 7×7 mm×0.35 mm in thickness, the semiconductor element and the inner lead unit of the lead frame are bonded through gold wires having a diameter of 25 µm) was produced by placing a lead frame mounted with a semiconductor element (silicon chip) or the like on a mold at 180° C., and then pre-heating the lead frame for 2 minutes so as to reproduce an oxidized state, and encapsulation molding the lead frame mounted with a semiconductor element (silicon chip) or the like by injecting an epoxy resin composition under the conditions of a mold temperature of 180° C. and an injection pressure of 7.4 MPa for a curing time of 120 seconds, using a low pressure transfer molding machine (manufactured by Dai-ichi Seiko Co., Ltd., GP-ELF). Six semiconductor devices that had been heat treated for 4 hours at 175° C. as a post-cure, were subjected to humidification for 120 hours at 60° C. and a relative humidity of 60%, and then were subjected to an IR reflow treatment (260° C., according to the conditions of JEDEC Level 3). The presence or absence of detachment and cracking inside these semiconductor devices was observed using an ultrasonic reflectoscope (manufactured by Hitachi Kenki Finetech Co., Ltd., MI-SCOPE10), and a semiconductor device in which any one of detachment or cracking had occurred was considered defective. The number of defective semiconductor devices among n=6 samples was indicated. If the number of defective devices is 1 or less, it is practically usable.

TABLE 1

|  |  | Example |  |  |  |  |  |  |  | Comparative Example |  |  |  |
|---|---|---|---|---|---|---|---|---|---|---|---|---|---|
|  |  | 1 | 2 | 3 | 4 | 5 | 6 | 7 | 8 | 1 | 2 | 3 | 4 |
| Component (A) | Epoxy resin 1 | 3.01 | 3.01 | 3.01 | 3.01 | 3.01 | 5.69 |  | 2.86 | 3.01 | 3.01 | 3.01 | 3.01 |
|  | Epoxy resin 2 | 3.01 | 3.01 | 3.01 | 3.01 | 3.01 |  |  |  | 3.01 | 3.01 | 3.01 | 3.01 |
|  | Epoxy resin 3 |  |  |  |  |  |  | 6.80 |  |  |  |  |  |
|  | Epoxy resin 4 |  |  |  |  |  |  |  | 3.41 |  |  |  |  |
| Component (B) | Phenolic resin 1 | 5.18 | 5.18 | 5.18 | 5.18 | 5.18 | 5.49 | 4.44 | 4.93 | 5.18 | 5.18 | 5.18 | 5.18 |
| Component (C) | Inorganic filler material 1 | 88 | 88 | 88 | 88 | 88 | 88 | 88 | 88 | 88 | 88 | 88 | 88 |
| Component (D) | 1-Alkene (C28-60) | 0.02 | 0.04 | 0.01 |  |  | 0.02 | 0.02 | 0.02 | 0.20 |  |  |  |
|  | 1-Alkene (C20-24) |  |  |  | 0.02 |  |  |  |  |  | 0.20 |  |  |
|  | 1-Alkene (C10) |  |  |  |  | 0.02 |  |  |  |  |  | 0.20 |  |
| Component (E) | Compound 1 | 0.18 | 0.16 | 0.19 | 0.18 | 0.18 | 0.18 | 0.18 | 0.18 |  |  |  | 0.18 |
|  | Compound 2 |  |  |  |  |  |  |  |  |  |  |  |  |
|  | Compound 3 |  |  |  |  |  |  |  |  |  |  |  |  |
|  | Compound 4 |  |  |  |  |  |  |  |  |  |  |  |  |
|  | Compound 5 |  |  |  |  |  |  |  |  |  |  |  |  |
|  | Compound 6 |  |  |  |  |  |  |  |  |  |  |  |  |
|  | Montanic acid-based wax |  |  |  |  |  |  |  |  |  |  |  |  |
| Other releasing agent | Polyethylene oxide wax |  |  |  |  |  |  |  |  |  |  |  | 0.02 |
| Other additive | Curing accelerator 1 | 0.27 | 0.27 | 0.27 | 0.27 | 0.27 | 0.29 | 0.23 | 0.26 | 0.27 | 0.27 | 0.27 | 0.27 |
|  | Coupling agent 1 | 0.03 | 0.03 | 0.03 | 0.03 | 0.03 | 0.03 | 0.03 | 0.03 | 0.03 | 0.03 | 0.03 | 0.03 |
|  | Colorant 1 | 0.3 | 0.3 | 0.3 | 0.3 | 0.3 | 0.3 | 0.3 | 0.3 | 0.3 | 0.3 | 0.3 | 0.3 |
| Evaluation results | Adhesive strength of copper oxide [N] | 15 | 14 | 15 | 16 | 17 | 16 | 16 | 12 | 5 | 6 | 8 | 10 |
|  | Determination result | ⊙ | ⊙ | ⊙ | ⊙ | ⊙ | ⊙ | ⊙ | ○ | X | X | X | X |
|  | Mold release load [N] | 10 | 10 | 12 | 12 | 13 | 11 | 11 | 10 | 8 | 9 | 10 | 12 |
|  | Determination result | ⊙ | ⊙ | ⊙ | ⊙ | ○ | ⊙ | ⊙ | ⊙ | ⊙ | ⊙ | ⊙ | ⊙ |
|  | Continuous moldability — Mold contamination | A | B | A | A | A | B | B | B | E | E | E | D |
|  | Continuous moldability — Package contamination | A | B | A | A | A | B | B | B | E | E | E | D |
|  | Resistance to solder (number of defective packages) | 0 | 0 | 0 | 0 | 0 | 0 | 0 | 3 | 10 | 8 | 7 | 4 |

TABLE 2

|  |  | Example |  |  |  |  |  | Comparative Example |  |  |  |
|---|---|---|---|---|---|---|---|---|---|---|---|
|  |  | 9 | 10 | 11 | 12 | 13 | 14 | 5 | 6 | 7 | 8 |
| Component (A) | Epoxy resin 1 | 3.01 | 3.01 | 3.01 | 3.01 | 3.01 | 3.01 | 3.01 | 3.01 | 3.01 | 3.01 |
|  | Epoxy resin 2 | 3.01 | 3.01 | 3.01 | 3.01 | 3.01 | 3.01 | 3.01 | 3.01 | 3.01 | 3.01 |
|  | Epoxy resin 3 |  |  |  |  |  |  |  |  |  |  |
|  | Epoxy resin 4 |  |  |  |  |  |  |  |  |  |  |
| Component (B) | Phenolic resin 1 | 5.18 | 5.18 | 5.18 | 5.18 | 5.18 | 5.18 | 5.18 | 5.18 | 5.18 | 5.18 |
| Component (C) | Inorganic filler material 1 | 88 | 88 | 88 | 88 | 88 | 88 | 88 | 88 | 88 | 88 |
| Component (D) | 1-Alkene (C28-60) | 0.02 | 0.02 | 0.02 | 0.02 | 0.02 | 0.02 |  |  |  |  |
|  | 1-Alkene (C20-24) |  |  |  |  |  |  |  |  |  |  |
|  | 1-Alkene (C10) |  |  |  |  |  |  |  |  |  |  |
| Component (E) | Compound 1 |  |  |  |  |  |  |  |  |  |  |
|  | Compound 2 | 0.18 |  |  |  |  |  | 0.20 |  |  |  |
|  | Compound 3 |  | 0.18 |  |  |  |  |  |  |  |  |
|  | Compound 4 |  |  | 0.18 |  |  |  | 0.20 |  |  |  |
|  | Compound 5 |  |  |  | 0.18 |  |  |  | 0.20 |  |  |
|  | Compound 6 |  |  |  |  | 0.18 |  |  | 0.20 |  |  |
|  | Montanic acid-based wax |  |  |  |  |  | 0.18 |  |  |  |  |
| Other releasing agent | Polyethylene oxide wax |  |  |  |  |  |  |  |  |  |  |
| Other additive | Curing accelerator 1 | 0.27 | 0.27 | 0.27 | 0.27 | 0.27 | 0.27 | 0.27 | 0.27 | 0.27 | 0.27 |
|  | Coupling agent 1 | 0.03 | 0.03 | 0.03 | 0.03 | 0.03 | 0.03 | 0.03 | 0.03 | 0.03 | 0.03 |
|  | Colorant 1 | 0.3 | 0.3 | 0.3 | 0.3 | 0.3 | 0.3 | 0.3 | 0.3 | 0.3 | 0.3 |

TABLE 2-continued

|  |  | Example | | | | | | Comparative Example | | | |
| --- | --- | --- | --- | --- | --- | --- | --- | --- | --- | --- | --- |
|  |  | 9 | 10 | 11 | 12 | 13 | 14 | 5 | 6 | 7 | 8 |
| Evaluation results | Adhesive strength of copper oxide [N] | 16 | 13 | 18 | 12 | 20 | 19 | 20 | 22 | 19 | 22 |
|  | Determination result | ⊙ | ○ | ⊙ | ○ | ⊙ | ⊙ | ⊙ | ⊙ | ⊙ | ⊙ |
|  | Mold release load [N] | 11 | 9 | 12 | 8 | 15 | 15 | 16 | 18 | 15 | 18 |
|  | Determination result | ⊙ | ⊙ | ⊙ | ⊙ | ○ | ○ | X | X | ○ | X |
| Continuous moldability | Mold contamination | B | B | B | C | C | B | C | D | D | D |
|  | Package contamination | B | B | B | C | C | B | C | D | D | D |
| Resistance to solder (number of defective packages) |  | 0 | 1 | 0 | 1 | 1 | 0 | 0 | 0 | 0 | 0 |

Examples 1 to 14 are compositions each containing (A) an epoxy resin, (B) a curing agent, (C) an inorganic filler material, (D) a hydrocarbon compound having structures of formula (1) and formula (2), and (E) a hydrocarbon compound having an ester group, while the amount of incorporation of the component (A), the type and amount of incorporation of the component (D), and the type and amount of incorporation of the component (E) are varied. However, all of the Examples exhibited results of high adhesive strength to copper oxide, and excellent resistance to solder as a result of an IR reflow treatment after a humidification treatment using lead frames that had undergone oxidation. Furthermore, Examples 1 to 14 all had low mold release loads, and excellent results in the continuous moldability (mold contamination, package contamination, and air vent blockage) in the case of encapsulation molding a semiconductor element or the like were obtained.

Among them, Examples 1 to 3, 6, 7, and 9 that used at least one or more of the epoxy resin 1 which is a biphenyl type epoxy resin represented by the formula (3), the epoxy resin 2 which is a phenol-aralkyl type epoxy resin having a phenylene skeleton represented by the formula (4), and the epoxy resin 3 which is a phenol-aralkyl type epoxy resin having a biphenylene skeleton represented by the formula (5), as the component (A) in an amount of 50% by mass or more; a 1-alkene having 28 to 60 carbon atoms as the component (D); and the compound 1 obtained by esterifying a copolymer of a 1-alkene having 28 to 60 carbon atoms and maleic anhydride with an alcohol having 18 carbon atoms, or the compound 2 obtained by esterifying a copolymer of a 1-alkene having 28 to 60 and maleic anhydride with an alcohol having 10 carbon atoms, as the component (E), exhibited results in which an excellent balance is achieved between the adhesive strength to copper oxide, resistance to solder, mold releasability (mold release load), and continuous moldability (mold contamination, package contamination, and air vent blockage).

Examples 4 and 5 that used a 1-alkene having 20 to 24 carbon atoms or a 1-alkene having 10 carbon atoms as the component (D), exhibited satisfactory adhesive strength to copper oxide, satisfactory resistance to solder, and satisfactory continuous moldability in terms of mold contamination and package contamination, but exhibited a tendency of slightly higher mold release load, and resulted in slightly poor continuous moldability in terms of air vent blockage.

Example 8 that used the epoxy resin 4 which is an ortho-cresol-novolac type epoxy resin as the component (A) in an amount of 54.4% by mass, exhibited satisfactory mold releasability (mold release load) and satisfactory continuous moldability (mold contamination, package contamination, and air vent blockage), but tended to have slightly lower adhesive strength to copper oxide, and resulted in slightly poor resistance to solder.

Example 10 that used the compound 3 which was obtained by esterifying a copolymer of a 1-alkene having 28 to 60 carbon atoms and maleic anhydride with an alcohol having 22 carbon atoms as the component (E), exhibited satisfactory mold releasability (mold release load) and satisfactory continuous moldability (mold contamination, package contamination, and air vent blockage), but tended to have slightly lower adhesive strength to copper oxide, and resulted in slightly poor resistance to solder.

Example 11 that used the compound 4 which was obtained by esterifying a copolymer of a 1-alkene having 28 to 60 carbon atoms and maleic anhydride with an alcohol having 8 carbon atoms as the component (E), exhibited satisfactory adhesive strength to copper oxide, satisfactory resistance to solder, and satisfactory continuous moldability in terms of mold contamination and package contamination, but tended to exhibit slightly higher mold release load, and resulted in slightly poor continuous moldability in terms of air vent blockage.

Example 12 that used the compound 5 which was obtained by esterifying a copolymer of a 1-alkene having 28 to 60 carbon atoms and maleic anhydride with an alcohol having 28 carbon atoms as the component (E), exhibited satisfactory mold releasability (mold release load) and satisfactory continuous moldability in terms of air vent blockage, but tended to exhibit slightly lower adhesive strength to copper oxide, and resulted in slightly poor resistance to solder. Furthermore, Example 12 resulted in slightly poor continuous moldability in terms of mold contamination and package contamination.

Example 13 that used the compound 6 which was obtained by esterifying a copolymer of a 1-alkene having 20 to 24 carbon atoms and maleic anhydride with an alcohol having 18 carbon atoms as the component (E), exhibited satisfactory adhesive strength to copper oxide and satisfactory resistance to solder, but resulted in slightly higher mold release load and slightly poor continuous moldability in terms of air vent blockage. Furthermore, Example 13 resulted in slightly poor continuous moldability in terms of mold contamination and package contamination.

Example 14 that used a montanic acid ester wax as the component (E), exhibited satisfactory adhesive strength to copper oxide, satisfactory resistance to solder, and satisfactory continuous moldability in terms of mold contamination and package contamination, but tended to exhibit slightly higher mold release load, and resulted in slightly poor continuous moldability in terms of air vent blockage.

On the other hand, Comparative Examples 1 to 3 that did not contain the component (E), exhibited markedly low adhesive strength to copper oxide, and resulted in markedly poor resistance to solder as a result of an IR reflow treatment after a humidification treatment using lead frames that had undergone oxidation. Furthermore, Comparative Examples 1 to 3 resulted in markedly poor continuous moldability in terms of mold contamination and package contamination.

Comparative Example 4 that used polyethylene oxide wax instead of the component (D), resulted in poor adhesive strength to copper oxide and poor resistance to solder. Furthermore, Comparative Example 4 resulted in poor continuous moldability in terms of mold contamination and package contamination.

Comparative Examples 5 to 8 that did not use the component (D), but used the compounds 2 and 4 to 6 as the component (E), resulted in markedly higher mold release loads as compared with Examples 9 and 11 to 13 that are different only in terms of using a 1-alkene having 28 to 60 carbon atoms as the component (D). Furthermore, Comparative Examples 5 to 8 resulted in poorer continuous moldability in terms of mold contamination and package contamination, as compared with Examples 9 and 11 to 13.

According to the present invention, since an epoxy resin composition for semiconductor encapsulation that is excellent in the adhesiveness to copper lead frames that have undergone oxidation, mold releasability, continuous moldability and the like as disclosed in the Examples, this epoxy resin composition for semiconductor encapsulation can be suitably used in semiconductor packages that are susceptible to the oxidation of lead frames made of copper, such as in the case of electronic components such as IC and LSI, and particularly in MCPs (Multi Chip Stacked Packages) in which semiconductor chips are laminated in multilayers.

The invention claimed is:

1. An epoxy resin composition for semiconductor encapsulation, comprising:
    (A) an epoxy resin;
    (B) a curing agent;
    (C) an inorganic filler material;
    (D) a hydrocarbon compound having structures of formula (1) and formula (2):

  (1)

  (2), and
    (E) a hydrocarbon compound having an ester group, wherein the component (E) is a compound obtained by semi-esterifying a copolymer, comprising the reaction product of a mixture of 1-alkenes having 28 to 60 carbon atoms with maleic anhydride, with a long-chain aliphatic alcohol having 8 to 20 carbon atoms;
    wherein the mixing ratio of component (D) and component (E) is 1:4 to 1:20 as a mass ratio,
    wherein the total amount of incorporation of component (D) and component (E) is equal to or greater than 0.5 parts by mass and equal to or less than 10 parts by mass relative to 100 parts by mass of the epoxy resin of component (A), and
    wherein the component (D) is a 1-alkene having 10 or more carbon atoms.

2. The epoxy resin composition for semiconductor encapsulation according to claim 1, wherein the component (D) is a 1-alkene having 28 or more carbon atoms.

3. The epoxy resin composition for semiconductor encapsulation according to claim 1, wherein the component (E) is a compound obtained by semi-esterifying a copolymer of a mixture of 1-alkenes having 28 to 60 carbon atoms and maleic anhydride with a long-chain aliphatic alcohol having 15 to 20 carbon atoms.

4. The epoxy resin composition for semiconductor encapsulation according to claim 1,
    wherein the component (A) includes at least one epoxy resin selected from the group consisting of a biphenyl type epoxy resin represented by the formula (3), a phenol-aralkyl type epoxy resin having a phenylene skeleton represented by the formula (4), and a phenol-aralkyl type epoxy resin having a biphenylene skeleton represented by the formula (5):

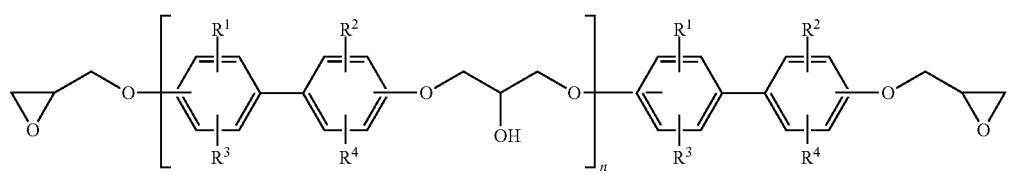

(3)

wherein in the formula (3), $R^1$ to $R^4$ each represents a hydrogen atom, or a substituted or unsubstituted hydrocarbon group having 1 to 10 carbon atoms, while $R^1$s to $R^4$s may be all identical with or different from each other; and n represents an integer from 0 to 3;

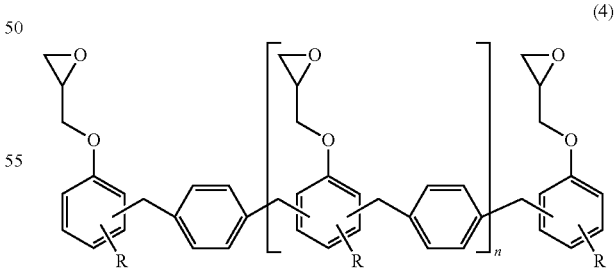

(4)

wherein in the formula (4), R represents a hydrogen atom, or a substituted or unsubstituted hydrocarbon group having 1 to 10 carbon atoms, while Rs may be all identical with or different from each other; and n represents an integer from 0 to 20; and

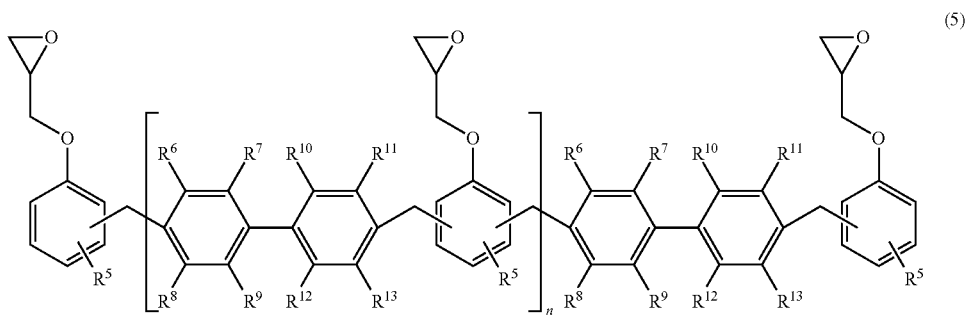

(5)

wherein in the formula (5), $R^5$ to $R^{13}$ each represents a hydrogen atom, or a substituted or unsubstituted hydrocarbon group having 1 to 10 carbon atoms, while $R^5$s to $R^{13}$s may be all identical with or different from each other; and n represents an integer from 0 to 3.

5. A semiconductor device comprising a semiconductor element encapsulated with the epoxy resin composition for semiconductor encapsulation according to claim 1.

6. The semiconductor device according to claim 5, further comprising a lead frame made of copper.

* * * * *